United States Patent
US 11,459,231 B2
Blankenship
Oct. 4, 2022

(54) MICROELECTRONIC ISOLATION SYSTEM

(71) Applicant: UNITED STATES GOVERNMENT AS REPRESENTED BY THE SECRETARY OF THE ARMY, Washington, DC (US)

(72) Inventor: Clinton Blankenship, Redstone Arsenal, AL (US)

(73) Assignee: United States Government as represented by the Secretary of the Army, Washington, DC (US)

(*) Notice: Subject to any disclaimer, the term of this patent is extended or adjusted under 35 U.S.C. 154(b) by 0 days.

(21) Appl. No.: 17/101,732

(22) Filed: Nov. 23, 2020

(65) Prior Publication Data

US 2022/0162057 A1 May 26, 2022

(51) Int. Cl.
*B81B 7/00* (2006.01)
*B81B 3/00* (2006.01)

(52) U.S. Cl.
CPC .................... *B81B 7/0058* (2013.01)

(58) Field of Classification Search
CPC .................................................. B81B 7/0058
See application file for complete search history.

(56) References Cited

U.S. PATENT DOCUMENTS

| | | | |
|---|---|---|---|
| 4,872,343 A | 10/1989 | Peters | |
| 4,939,935 A | 6/1990 | Amand | |
| 5,668,329 A | 9/1997 | Petri | |
| 6,161,440 A | 12/2000 | Hulsing, II | |
| 6,617,712 B1 | 9/2003 | Dondi | |
| 8,955,382 B2 | 2/2015 | Dwyer | |
| 2002/0092352 A1 | 7/2002 | Foote | |
| 2007/0113702 A1 | 5/2007 | Braman et al. | |
| 2008/0087083 A1 | 4/2008 | Nishizawa | |
| 2008/0229566 A1 | 9/2008 | Saito | |
| 2011/0234206 A1 | 9/2011 | Kawakubo | |
| 2013/0068017 A1* | 3/2013 | Perkins | G01P 15/18 73/514.01 |
| 2016/0139170 A1 | 5/2016 | Dwyer | |

(Continued)

OTHER PUBLICATIONS

Yoon, Sang Won, Vibration Isolation and Shock Protections for MEMS, The University of Michigan, 2009.

*Primary Examiner* — Omar F Mojaddedi
(74) *Attorney, Agent, or Firm* — Alberto Interian, III

(57) ABSTRACT

The present disclosure provides a microelectronic isolation system comprising a base, vibration isolator, primary sensor, and microprocessor. The base supports the vibration isolator, the primary sensor, and the microprocessor. The vibration isolator has a platform, isolation material, and at least one isolation sensor. The isolation material dampens an overall vibrational frequency experienced by the microelectronic isolation system. The isolation sensor measures a displacement. The displacement is a measurement of a displacement of the platform with respect to the base. The primary sensor measures a primary sensor response, which is received by the microprocessor to calculate a plurality of responses. The plurality of responses of the microprocessor being one or a combination of a measured compensation response, an inertial response, and a restored primary sensor response.

16 Claims, 7 Drawing Sheets

(56) References Cited

U.S. PATENT DOCUMENTS

| | | | |
|---|---|---|---|
| 2016/0139171 A1* | 5/2016 | Becka | G01P 15/0922 |
| | | | 216/41 |
| 2020/0025792 A1* | 1/2020 | Reinke | B81B 7/007 |
| 2020/0064367 A1* | 2/2020 | Strehlow | H03H 9/02259 |
| 2022/0031194 A1* | 2/2022 | Ong | A61B 5/4848 |

* cited by examiner

MICROELECTRONIC ISOLATION SYSTEM

FIELD

The present disclosure generally relates to isolation platforms, and more specifically, to a microelectronic isolation system for decreasing or eliminating the effects of vibration and shock on miniaturized sensors or systems.

BACKGROUND

Isolation systems enable sensors to survive and operate in environments prone to harsh vibration and shock events. Isolation systems are used within a multitude of fields, ranging from military to civilian applications. Many inertial sensors, however, experience significant performance degradation when exposed to repeated vibrational frequency in the form of mechanical shock. This is especially true of vibratory Micro-Electro-Mechanical System (MEMS) gyroscopes and MEMS accelerometers.

MEMS inertial sensors can be represented as spring, mass, and damper systems, often etched out of silicon and being approximately 20 micrometers to 1 millimeter in length. One can infer from this generalization that these sensors can have one or more resonant oscillatory modes, or resonant frequencies. Large errors in an output of the sensors can occur if vibrational frequency at or near the resonant frequency is applied to the isolation system. Significant mechanical shock events on a system (e.g., drop, earthquake, or explosion) can cause sudden acceleration of the system and can also excite the resonant frequency of the system and lead to significant error in outputs or degradation of the physical system itself. In addition, timing sources also suffer sensitivities due to vibration, as many of them are resonant structures such as crystal oscillators, whereas other timing sources are greatly dependent on optical alignment.

A common approach to protecting a sensor from vibrational frequency within an isolation system 2 is to mount a device with an elastomer or spring-based isolator 1, as illustrated in FIG. 1. Isolation systems such as the aforementioned rely on the low pass response of an elastomer or spring-based isolator to provide observability of low-frequency dynamics while attenuating higher frequency energy that would negatively affect system performance. However, typical isolation systems still suffer from misalignments, such as errors in position, velocity and/or altitude, when exposed to repeated instances of acceleration or vibrational frequency due to deformation of the isolators themselves. For instance, misalignments can occur during launch, boost, and/or maneuver events for several aerial and land-based systems in which correct alignment is crucial. Subsequently, navigation errors build rapidly in time when such misalignments are present.

FIG. 2 provides an illustration of a Bode plot depicting notional response characteristics of a MEMS (micro-electronical mechanical systems) sensor 4 and a typical isolation system response 6. Many sensors, especially MEMS based inertial sensors, exhibit sensitivities at a resonant frequency 8. While these implementations protect the MEMs sensor 4 from some of the vibrational frequency, there still remains the potential of damage or disruption to the sensor's normal functionality.

Therefore, a new isolation system for miniature inertial and timing systems that measure and provide real time system updates of isolation platform misalignments is needed.

BRIEF SUMMARY

One embodiment of the present disclosure provides a microelectronic isolation system that has a base, a vibration isolator, a primary sensor, and a microprocessor. The base is mountable to another surface and supports the vibration isolator, the primary sensor, and the microprocessor. The vibration isolator has a platform, an isolation material, and at least one isolation sensor. The primary sensor measures a primary sensor response. The isolation material supports the platform from the base and dampens vibrational frequencies experienced by the base. The isolation sensor measures a displacement, which is a measurement of the displacement of the platform with respect to the base. The microprocessor calculates a restored primary sensor response utilizing an inertial response and a measured compensation response. The restored primary sensor response is a digital output of an overall vibrational frequency measured by the microelectronic isolation system without erroneous measurements caused by vibration and shock events.

BRIEF DESCRIPTION OF THE DRAWINGS

For a better understanding of the nature and objects of the disclosure, reference should be made to the following detailed description taken in conjunction with the accompanying drawings, in which.

Reference is made in the following detailed description of preferred embodiments to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim.

DETAILED DESCRIPTION

Figure 1:
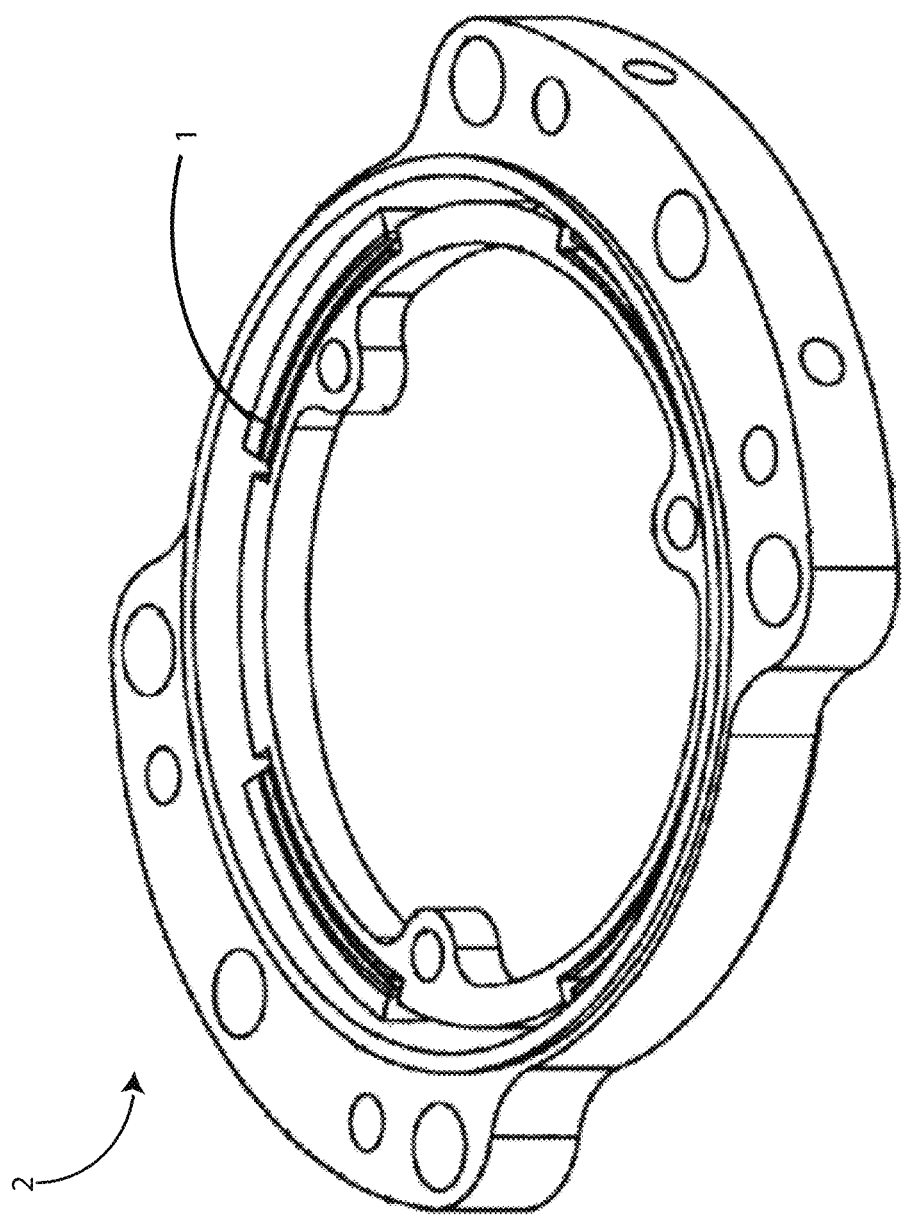
FIG. 1 is an isometric view of a typical microelectronic isolation system that mounts a sensor with an elastomer-based isolator.
Figure 2:
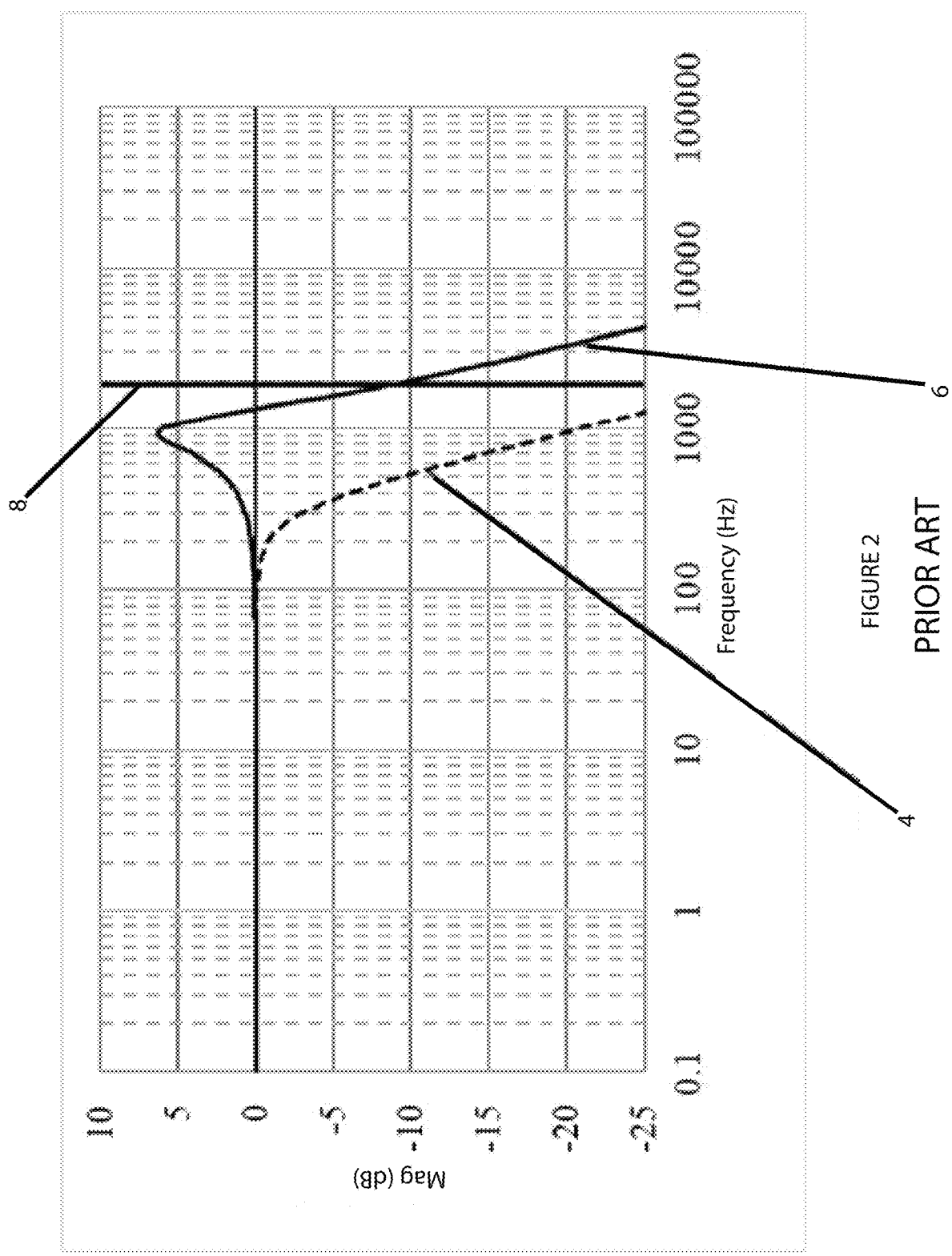
FIG. 2 is a Bode plot of a typical response characteristics of an elastomer or spring-based isolation system.
Figure 3:
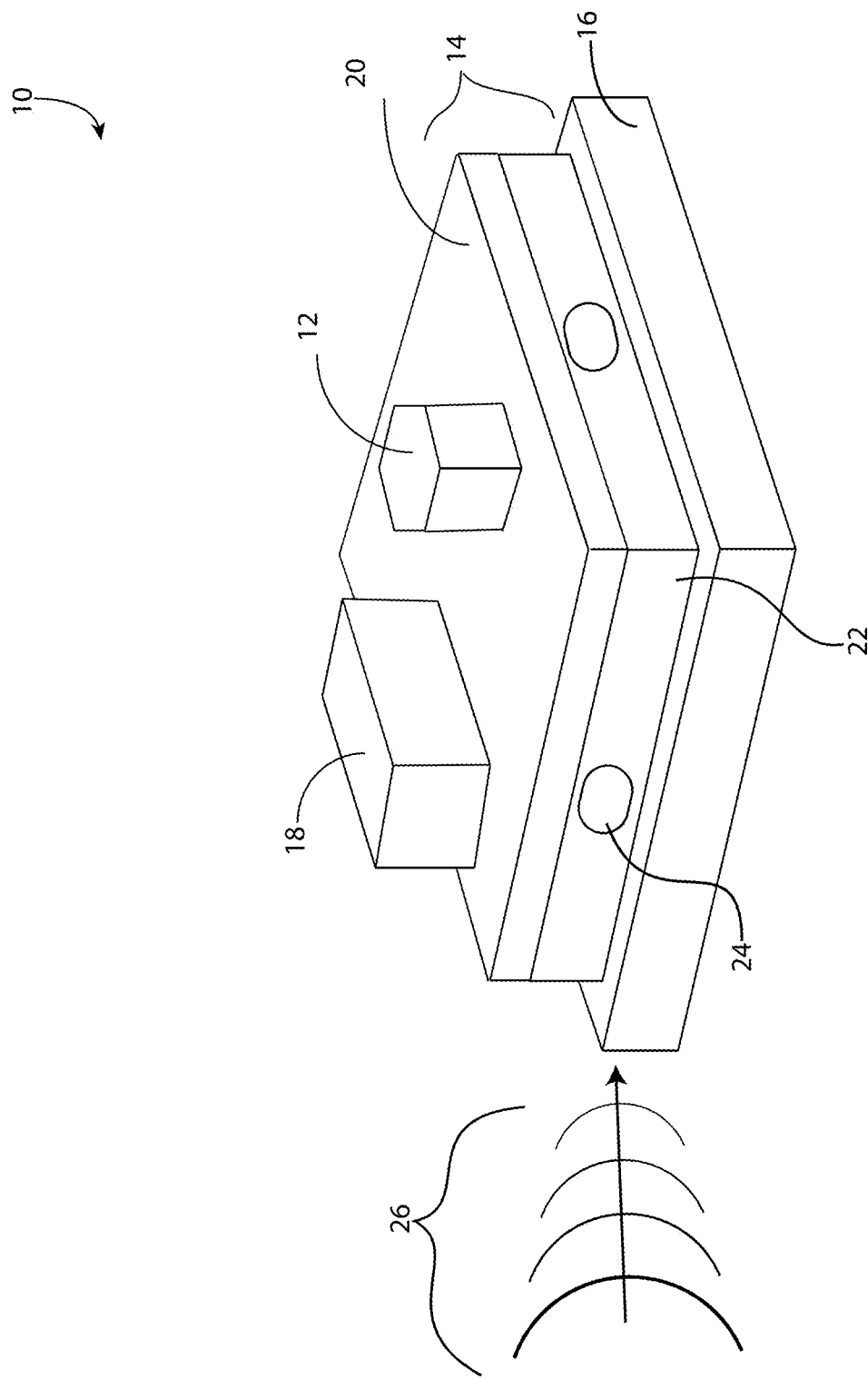
FIG. 3 is an isometric view of a microelectronic isolation system in accordance with the present disclosure.

The present disclosure provides a microelectronic isolation (MI) system 10 for decreasing or eliminating the effects of vibration and shock on miniaturized sensors and systems, more specifically, miniature inertial devices and timing systems. As seen in FIG. 3, the MI system 10 is comprised of a primary sensor 12, a vibration isolator 14, a base 16, and a microprocessor 18.

The primary sensor 12 of the MI system 10 is mounted on a platform 20 of the vibration isolator 14. The primary sensor 12 may be housed within a case (not shown) supported by the platform 20. The base 16 may be mountable to another surface via, for example, mounting bolts. Alternatively, the base 16 may be mountable via adhesive, welding, or any other suitable method for affixing two surfaces known to a person of ordinary skill in the art.

The vibration isolator 14 comprises the platform 20, an isolation material 22, and at least one isolation sensor 24. Isolation sensor 24 may be a laser based sensor when high resolution is required. Strain gauge type sensors could also be used. In the embodiment shown in FIG. 3 of the present disclosure, the vibration isolator 14 comprises two isolation sensors 24. Additional sensors 24 may be used. The isolation material 22 reduces physical degradation of the MI system 10 by dampening an overall vibrational frequency 26 due to vibration and shock events. The isolation material 22 may be oriented such that it connects the platform 20 to the base 16 in a substantially parallel configuration. The isolation material 22 may be any material and can be within any configuration know to a person having ordinary skill in the art that effectively dampens vibration and shock to the platform 20 while maintaining structural stability. In the embodiment shown in FIG. 3, the base 16, isolation material 22, and the platform 20 may be of a general rectangular cuboid shape; however, the shape may vary according to application without departing from the scope of the present disclosure. For example, in one embodiment of the present disclosure, the isolation material 22 may be one or more spring-based isolators. In an alternative embodiment, the isolation material 22 may be a polymer-based isolator, such as hydrogel.

Figure 4:
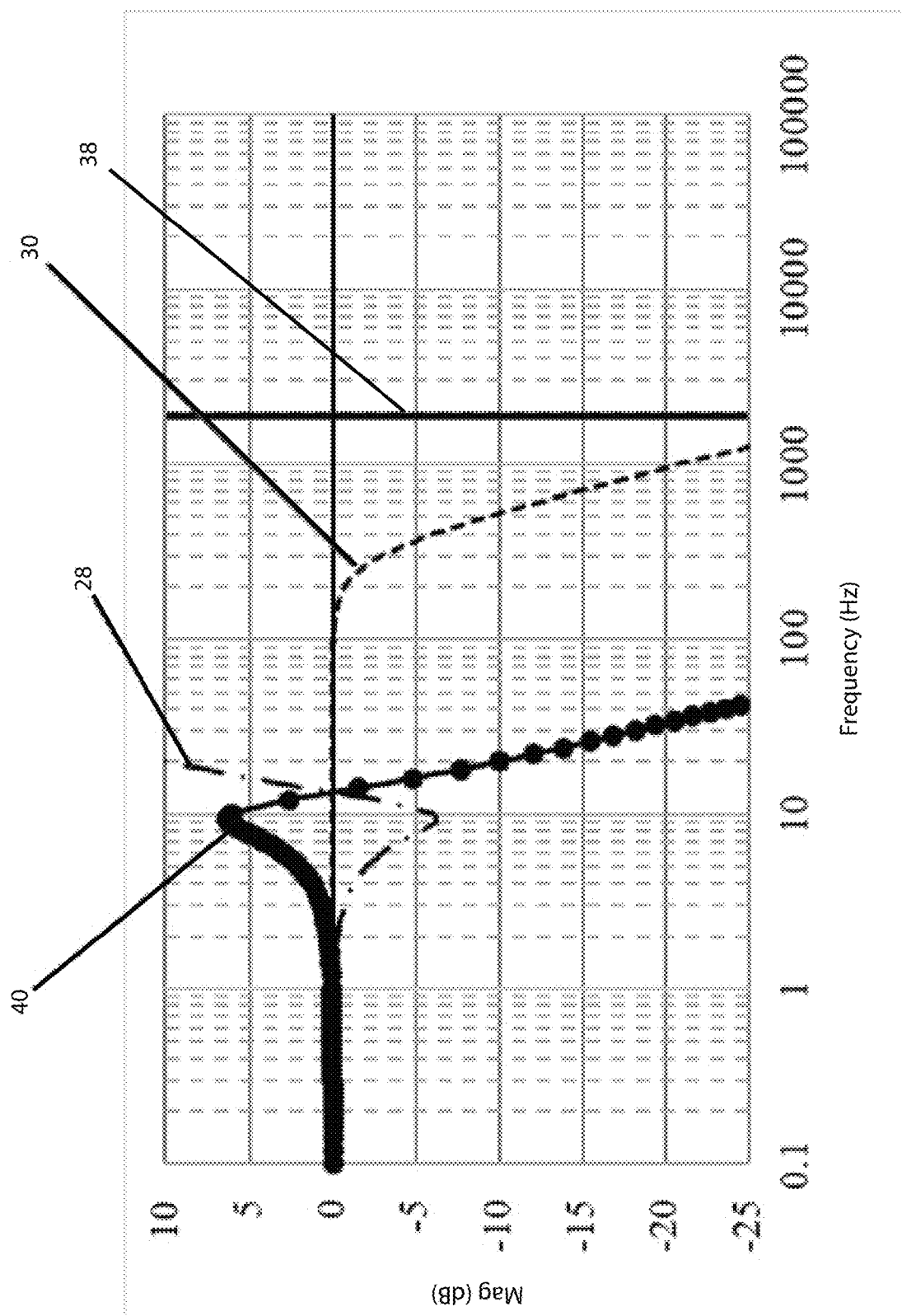
FIG. 4 is the Bode Plot of the microelectronic isolation system additionally including a measured compensation response and a restored primary sensor response.

When the MI system 10 is exposed to vibration and shock events, the MI system detects a measured compensation response 28, as shown in the Bode plot of FIG. 4, which is calculated based on a displacement measured by the isolation sensor 24, as best seen in FIG. 3. In the present embodiment, the isolation sensor 24 of the vibration isolator 14 may be embedded in the isolation material 22. The displacement of the platform 20 is caused by vibration and shock experienced by the base 16; such vibration or shock applied to the base, causes compression or expansion of the isolation material 22. The isolation material 22 prevents performance degradation of the primary sensor 12 when exposed to vibration and shock events.

Figure 5:
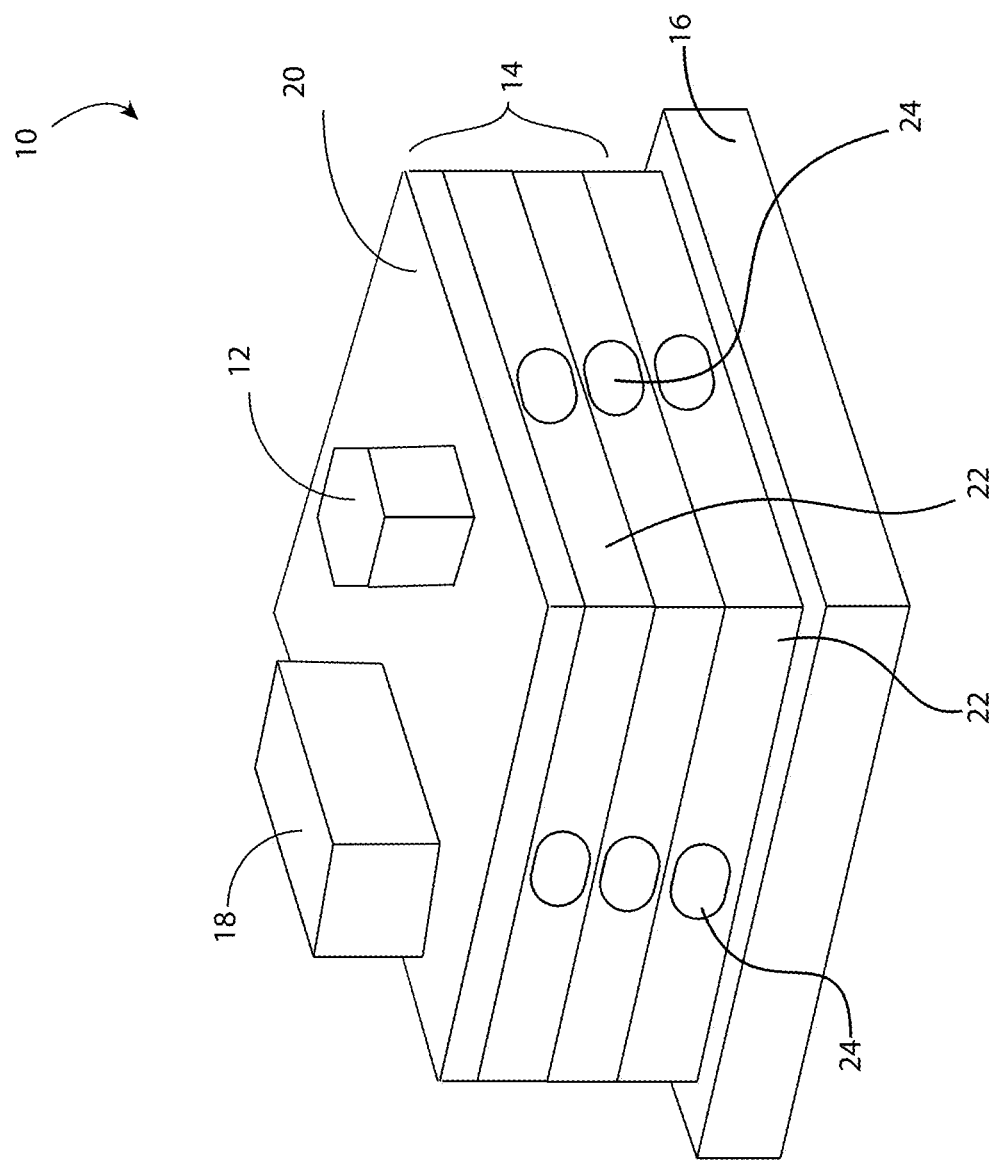
FIG. 5 is an isometric view of an alternative embodiment of the microelectronic isolation system in accordance with the present disclosure.
Figure 6:
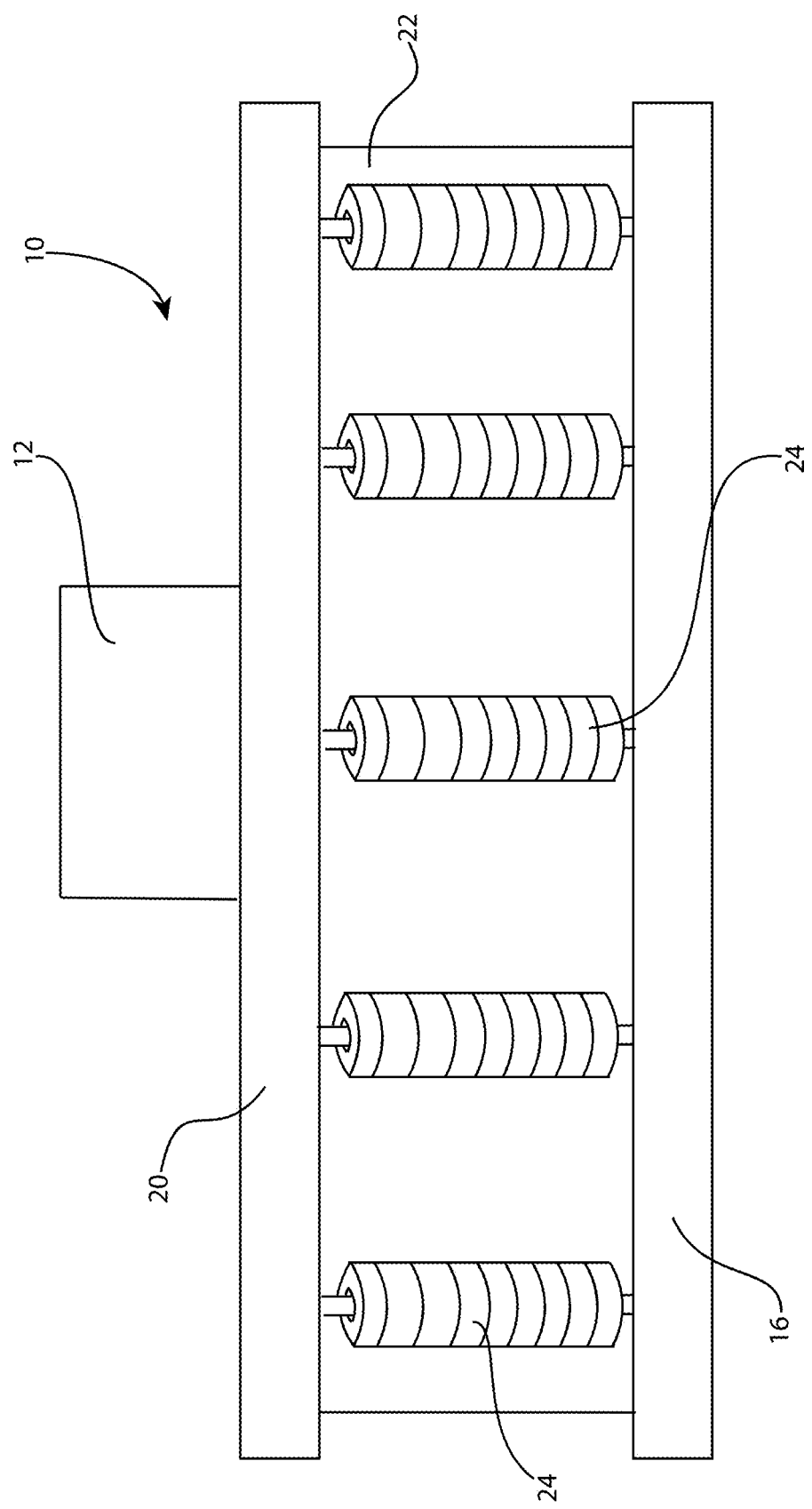
FIG. 6 is an additional embodiment wherein the microelectronic isolation system has a plurality of isolation sensors within the isolation material.
Figure 7:
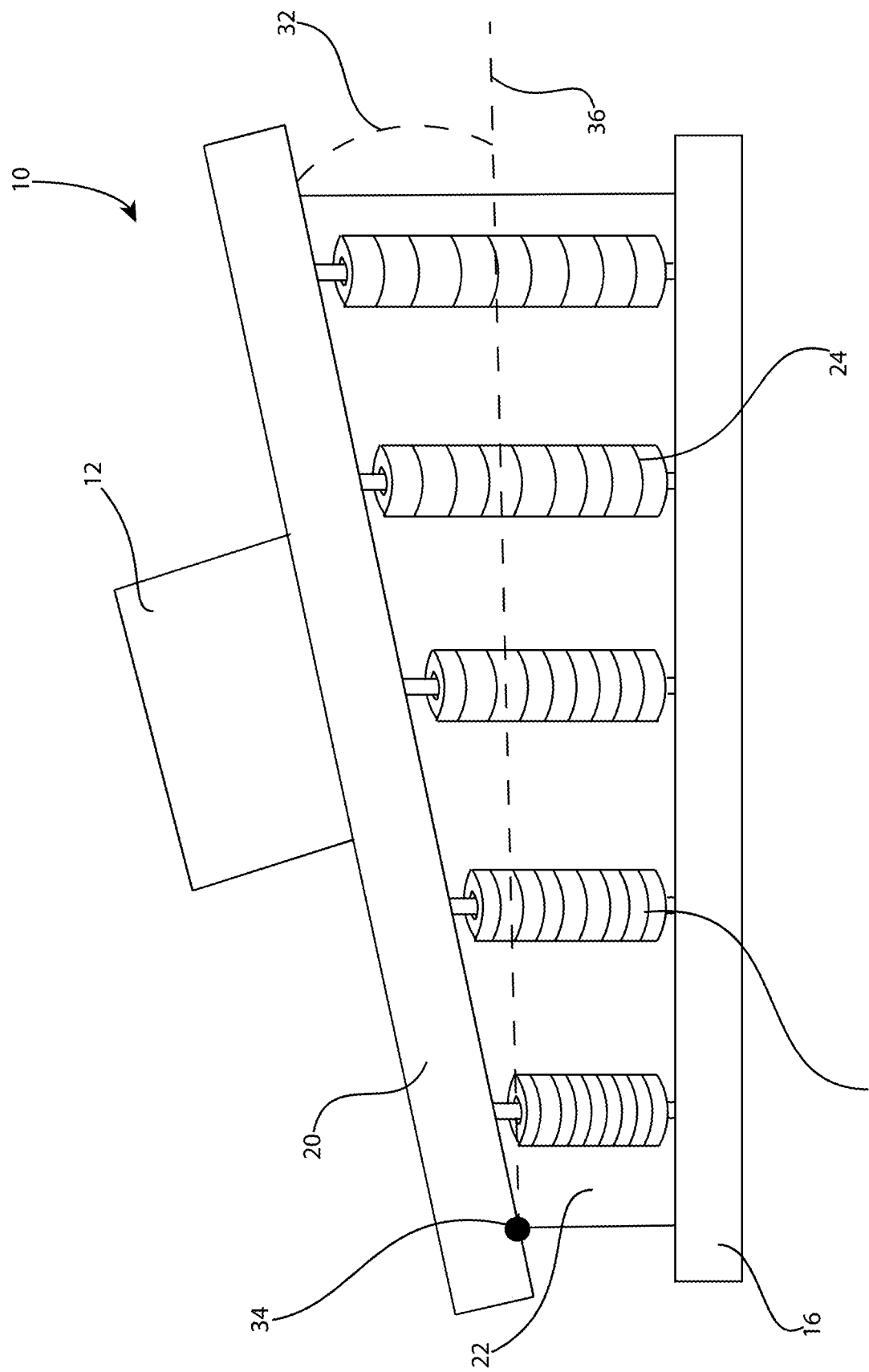
FIG. 7 is the additional embodiment of FIG. 6 having a displacement angle after experiencing a vibration or shock event.

The displacement may be a measurement in length of the platform 20 displaced relative to the base 16 (not shown). Alternatively, the displacement can be a change in angle or orientation of the platform 20 relative to the base 16, as best seen in FIG. 7. An important feature of the MI system 10 is the ability to determine misalignment of the primary sensor 12 input axes relative to the base 16. The misalignment of the primary sensor 12 input axis relative to the base 16 can be determined by measurement of a displacement angle 32 with respect to a variable reference point 34, and an axis of reference 36, wherein the axis of reference intersects the variable reference point on the platform 20. This measurement can be performed when there is more than one isolation sensor 24, as shown in FIG. 7. A person of ordinary skill in the art would understand that the MI system 10 could determine misalignment of the primary sensor 12 input axis relative to the base 16 using a single isolation sensor 24 if said sensor is capable of measuring necessary angles. The axis of reference 36 is approximately parallel to the base 16 and intersects with the variable reference point 34 on the platform 20. When the variable reference point 34 is not located at an end portion of the platform 20, the displacement may be determined by more than one displacement angle (e.g., an angle of expansion and an angle of compression) (not shown). The displacement angle 32 may be determined using geometric orientation of the platform 20 relative to the base 16 of the MI system 10. This displacement angle 32 enables proper interpretation by the microprocessor 18 of the output of the primary sensor 12. The microprocessor 18 utilizes the displacement angle 32 to determine a measured compensation response 28, as described in further detail below. The isolation sensor 24 may be located at any position that allows the isolation sensor to measure and record vibrational frequencies dampened by the isolation material 22. For example, in a non-illustrated alternative embodiment, the isolation sensor 24 can be located external to the isolation material 22. Alternatively, as illustrated in FIG. 5, the isolation material 22 may have multiple layers with isolation sensors 24 embedded throughout the isolation material in a plurality of locations. Further, as seen in an alternate embodiment of FIG. 6, the isolation material 22 may have one layer with a plurality of isolation sensors 24. Any number and/or combination of sensors and layers of isolation material can be employed without departing from the scope of the present disclosure.

The isolation sensor 24 may be electrically connected to the microprocessor 18 such that the displacement detected by the isolation sensor is processed by the microprocessor, including being processed from an analog format into a digital format. The measured compensation response 28 is calculated by the microprocessor 18 using the displacement measured by the isolation sensor 24. The microprocessor 18, as illustrated in FIGS. 3 and 5, may be affixed to the platform 20 of the MI system 10. In a non-illustrated embodiment, the microprocessor 18 may also be affixed to any portion of the MI system 10 without departing from the scope of the present disclosure.

Measuring the displacement of the platform 20 relative to the base 16 via the isolation sensor 24 enables the microprocessor 18 of the MI system 10 to calculate a restored primary sensor response 30 using response characteristics of material within the vibration isolator 14, the displacement measured by the isolation sensor 24, and data measured by the primary sensor 12, as discussed in further detail below.

A MI compensation value, which is determined at time of manufacture by shape, placement, and material properties of the vibration isolator 14, is preprogrammed and stored in the microprocessor 18. The MI compensation value is a reciprocal of an isolation material value. The isolation material value being defined as a time value associated with the displacement of the platform in relation to the base during a shock event and can be validated using testing. It can be represented by the following equation:

$$MI\ Compensation\ Value = \frac{1}{Isolation\ Material\ Value}$$

The primary sensor 12, mounted on the platform 20 of the vibration isolator 14, may be a MEMS sensor configured to measure a primary sensor response that is a fraction of inertial forces acting upon the MI system 10, wherein the primary sensor response may be defined as a measurement of force, angular rate, displacement, and/or orientation. The MEMS sensor can be a MEMS accelerometer, a MEMS gyroscope, or a MEMS inertial measurement unit, which are capable of measuring the primary sensor response. The primary sensor 12 may be electrically connected to the microprocessor 18 such that the primary sensor response detected by the primary sensor is processed by the microprocessor from an analog format into a digital format. In an exemplary embodiment, the microprocessor 18 may be an electronic component that receives the primary sensor response measured by the primary sensor 12 and the displacement measurements by the isolation sensor 24. The microprocessor 18 can utilize the primary sensor response and the isolation material value to calculate an inertial response 40, as seen in the Bode plot of FIG. 4. The inertial response is defined as a calculated response using the data from the primary sensor 12 and the known isolation material value. The measured compensation response 28 can be used to validate calculation of the inertial response 40 by using the measured compensation response and the inertial response to calculate a restored primary sensor response. In an exemplary embodiment, the primary sensor response and the restored primary sensor response are approximately equivalent. The measured compensation response 28, which is calculated by the microprocessor 18, in response to receiving displacements from the isolation sensor 24, is expected to be equivalent to the MI compensation value, which is pre-determined based off of the isolation material value in the present disclosure. The inertial response 40 can be represented as follows:

Inertial Response =Isolation Material Value×Primary Sensor Response

In the present embodiment of the disclosure, the microprocessor 18 may use the inertial response 40 and the measured compensation response 28 to calculate a restored primary sensor response 30, which is a digital output of forces experienced by the primary sensor 12 in absence of vibrational frequencies experienced by the MI system, as illustrated on the Bode Plot of FIG. 4. The restored primary sensor response 30 may be calculated using the equation below:

Restored primary sensor response=Measured Compensation Response×Inertial Response The inertial response 40 and the measured compensation response 28 consist of zeros and poles. Since the measured compensation response 28 is equivalent to the MI compensation value, a reciprocal of the isolation material value, the zeros of the inertial response 40 are equivalent to the poles of the measured compensation response 28 and the poles of the inertial response are equivalent to the zeros of the measured compensation response 28. The product of the measured compensation response 28 and the inertial response 40 results in the cancellation of the vibration isolator value, within the inertial response, and the measured compensation response, resulting in the restored primary sensor response 30. This calculation is performed by the microprocessor 18, outputting the restored primary sensor response 30, which is best represented on the Bode plot in FIG. 4. The format for displaying the digital signals outputted by the microprocessor 18 could be, but not limited to, electronic, opto-electronic interfaces or any analog to digital converters for generation of useful output signals.

The ability to restore the primary sensor response allows for the MI system to operate during shock events that would have originally approached and/or passed a mechanical resonant frequency 38 of the primary sensor 12, as seen in FIG. 4. The mechanical resonant frequency 38 is defined as a frequency at which the primary sensor experiences continuous oscillation and/or performance degradation. Shown in FIG. 4, the mechanical resonant frequency 38 of the present embodiment of the primary sensor 12 is approximately 2000 Hz. Vibration or shock that induce frequencies at 2000 Hz or near 2000 Hz would originally cause the primary sensor of this embodiment to experience performance degradation. In accordance with this present disclosure, the primary sensor 12 will experience vibration and shock events occurring at frequencies less than the restored primary sensor response 30 due to the isolation material 22 limiting forces that can be vibrational in nature or otherwise, experienced by the primary sensor.

The foregoing description has been presented for the purposes of illustration and description. It is not intended to be exhaustive or to limit the disclosure to the precise form disclosed. Many modifications and variations are possible in view of this disclosure. Indeed, while certain features of this disclosure have been shown, described and/or claimed, it is not intended to be limited to the details above, since it will be understood that various omissions, modifications, substitutions and changes in the apparatuses, forms, method, steps and system illustrated and in its operation can be made by those skilled in the art without departing in any way from the spirit of the present disclosure.

Furthermore, the foregoing description, for purposes of explanation, used specific nomenclature to provide a thorough understanding of the disclosure. However, it will be apparent to one skilled in the art that the specific details are not required in order to practice the disclosure. Thus, the foregoing descriptions of specific embodiments of the present disclosure are presented for purposes of illustration and description. They are not intended to be exhaustive or to limit the disclosure to the precise forms disclosed, many modifications and variations are possible in view of the above teachings. The embodiments were chosen and described in order to best explain the principles of the disclosure and its practical applications, to thereby enable others skilled in the art to best utilize the disclosed system and method, and various embodiments with various modifications as are suited to the particular use contemplated.

What is claimed is:
1. A microelectronic isolation system comprising:
 a base, a vibration isolator, a primary sensor, and a microprocessor, wherein the base supports the vibration isolator, the primary sensor, and the microprocessor, and the base being configured to be mounted to a surface;
 wherein the vibration isolator comprises a platform, an isolation material, and at least one isolation sensor, wherein the isolation material supports the platform from the base, the isolation material being configured to dampen a vibrational frequency experienced by the microelectronic isolation system, the isolation sensor being configured to measure a displacement of the platform with respect to the base, and the platform supports the primary sensor;
 wherein the primary sensor has a mechanical resonant frequency, the primary sensor being a MEMS sensor configured to measure a primary sensor response; and
 wherein the microprocessor is configured to receive data from the isolation sensor and the primary sensor to calculate one or more responses, the calculated one or more responses being microprocessor digital outputs defined as forces acting on the microelectronic isolation system.

2. The microelectronic isolation system of claim 1, wherein the microprocessor is configured to use the primary sensor response and an isolation material value associated with the isolation material to calculate an inertial response.

3. The system of claim 2, wherein the inertial response is defined as a calculated response using data from the primary sensor and the isolation material value.

4. The microelectronic isolation system of claim 1, the digital output being defined as forces acting on the microelectronic isolation system in absence of erroneous output caused by vibration and shock events.

5. The microelectronic isolation system of claim 1, the one or more responses of the microprocessor being one or a combination of a measured compensation response, an inertial response, and a restored primary sensor response.

6. The system of claim 5, wherein the microprocessor is configured to use the measured compensation response to validate a calculation of the inertial response by using the measured compensation response and the inertial response to calculate a restored primary sensor response.

7. The microelectronic isolation system of claim 1, the one or more responses of the microprocessor being in absence of erroneous output caused by vibration and shock events.

8. The system of claim 1, wherein the at least one isolation sensor is located at one or more of the following positions: external to the isolation material, in a layer of the isolation material, and in a plurality of layers of the isolation material.

9. A microelectronic isolation system comprising:
a base, a vibration isolator, a primary sensor, and a microprocessor, wherein the base supports the vibration isolator, the primary sensor, and the microprocessor, and the base being configured to be mounted to a surface;
wherein the vibration isolator comprises a platform, an isolation material, and at least one isolation sensor, wherein the isolation material supports the platform from the base, the isolation material being configured to dampen a vibrational frequency experienced by the microelectronic isolation system, the isolation sensor being configured to measure a displacement of the platform with respect to the base, and the platform supports the primary sensor;
wherein the primary sensor has a mechanical resonant frequency, the primary sensor being a MEMS sensor configured to measure a primary sensor response;
wherein the microprocessor is configured to receive data from the isolation sensor and the primary sensor to calculate one or more responses, the calculated one or more responses being microprocessor digital outputs defined as forces acting on the microelectronic isolation system;
wherein the microprocessor is configured to use the primary sensor response and an isolation material value associated with the isolation material to calculate an inertial response; the one or more responses of the microprocessor being in absence of erroneous output caused by vibration and shock events.

10. The system of claim 9, wherein the microprocessor is configured to use the measured compensation response to validate a calculation of the inertial response by using the measured compensation response and the inertial response to calculate a restored primary sensor response.

11. The system of claim 9, wherein the at least one isolation sensor is located at one or more of the following positions: external to the isolation material, in a layer of the isolation material, and in a plurality of layers of the isolation material.

12. A microelectronic isolation method comprising:
using a microelectronic isolation system to calculate one or more forces acting on the microelectronic isolation system, wherein the microelectronic isolation system comprises:
a base, a vibration isolator, a primary sensor, and a microprocessor, wherein the base supports the vibration isolator, the primary sensor, and the microprocessor, and the base being configured to be mounted to a surface;
wherein the vibration isolator comprises a platform, an isolation material, and the isolation sensor, wherein the isolation material supports the platform from the base, the isolation material being configured to dampen a vibrational frequency experienced by the microelectronic isolation system, the isolation sensor being configured to measure a displacement of the platform with respect to the base, and the platform supports the primary sensor;
wherein the primary sensor has a mechanical resonant frequency, the primary sensor being a MEMS sensor configured to measure a primary sensor response; and
wherein the microprocessor is configured to receive data from the isolation sensor and the primary sensor to calculate one or more responses, the calculated one or more responses being microprocessor digital outputs defined as the forces acting on the microelectronic isolation system.

13. The method of claim 12, wherein the microprocessor uses the primary sensor response and an isolation material value associated with the isolation material to calculate an inertial response.

14. The method of claim 13, wherein the inertial response is defined as a calculated response using data from the primary sensor and the isolation material value.

15. The method of claim 12, the digital output being defined as forces acting on the microelectronic isolation system in absence of erroneous output caused by vibration and shock events.

16. The method of claim 12, the one or more responses of the microprocessor being one or a combination of a measured compensation response, an inertial response, and a restored primary sensor response.

* * * * *